United States Patent [19]

Plaas-Link

[11] Patent Number: 5,009,861
[45] Date of Patent: Apr. 23, 1991

[54] CRYSTALLIZATION APPARATUS

[75] Inventor: Andreas Plaas-Link, Hanover, Fed. Rep. of Germany

[73] Assignee: Intospace GmbH, Hanover, Fed. Rep. of Germany

[21] Appl. No.: 229,950

[22] Filed: Aug. 9, 1988

[30] Foreign Application Priority Data

Aug. 12, 1987 [DE] Fed. Rep. of Germany ....... 3726765
Nov. 16, 1987 [DE] Fed. Rep. of Germany ....... 3738840

[51] Int. Cl.⁵ .............. B01D 9/00; G01N 21/00; B01L 11/00; C30B 30/08
[52] U.S. Cl. ............................ 422/245; 422/58; 422/101; 422/240; 422/294; 156/DIG. 62
[58] Field of Search ............... 156/DIG. 62, 608, 607; 422/240, 294, 101, 245, 58, 56, 134; 435/101

[56] References Cited

U.S. PATENT DOCUMENTS 3,036,894  5/1962  Forestiere ........................ 422/58
4,263,010  4/1981  Randolph ........................ 422/245
4,755,363  7/1988  Fujita et al. .................... 422/245

OTHER PUBLICATIONS

Rodot et al, "Crystal Growth Method under Microgravity Conditions", Journal of Crystal Growth, 52 (1981), pp. 478-484.

Primary Examiner—Gary P. Straub
Attorney, Agent, or Firm—Shlesinger & Myers

[57] ABSTRACT

A crystallization apparatus 2, in particular for crystallizing proteins at zero gravity, comprises a crystallization cell consisting of an elastic tube 8 of which the ends can be sealed. Using a clamp means 10, the tube cavity can be reversibly divided into several cells 14, 14', 14" to receive various solutions depending on the particular crystallization.

31 Claims, 8 Drawing Sheets

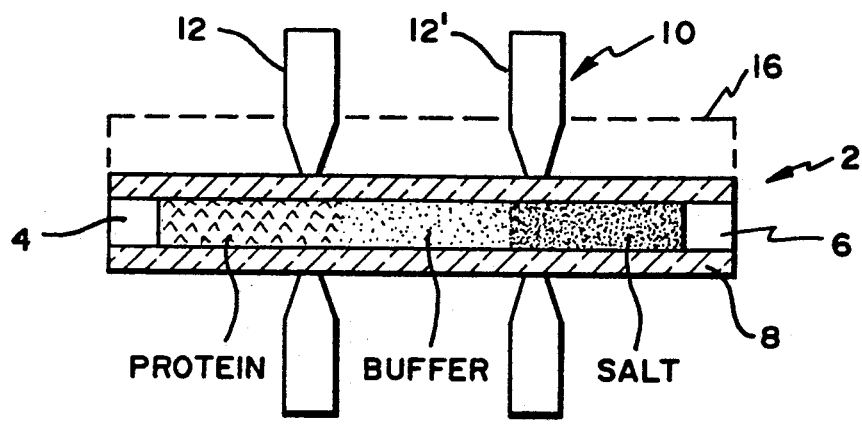
FIG. 4
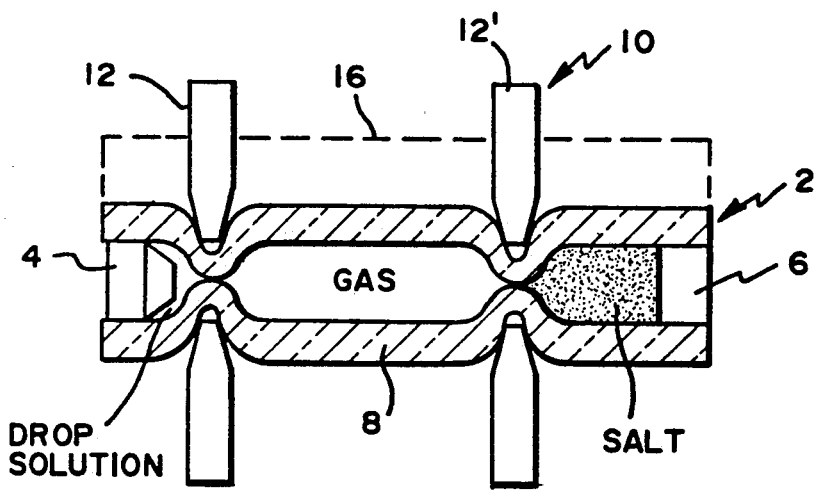
FIG. 7
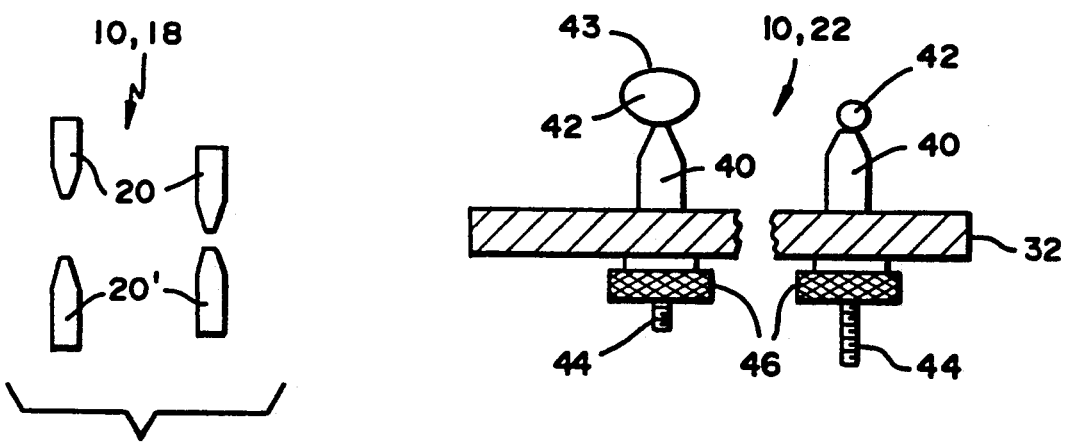
FIG. 5
FIG. 6

CRYSTALLIZATION APPARATUS

The invention concerns a crystallization apparatus, in particular for crystallizing proteins at zero-gravity.

Zero-gravity crystallization of proteins presently is carried out mainly in three ways, namely by salting out, by the drop method, and by the temperature-gradient method. These procedures are shown schematically in FIGS. 1, 2 and 3.

All these procedures are characterized in that very different batches are processed simultaneously. This means that to crystallize a protein, as a rule very different salt concentrations, additives and temperatures will be tested simultaneously. This is the case foremost of all for the drop method. The average duration of an experiment to the end of the crystallization goes from several days to a few months. This is the reason that another configuration of solution, temperature or salt concentration shall be testable not only after a negative empirical outcome. Accordingly in all three procedures, use is made of simplest possible equipment such as capillary tubes, standard vessels and as regards the salting-out method, but most of all the drop method, use is made of special boxes with 10 to 50 different zones to assemble the samples. As a result the scientist preparing his experiments-which are carried out in amounts of the order of micrograms—must be provided with simple guidelines to carry them out. Moreover procedures and apparatus for carrying out these procedures should be offered, which shall allow processing in the manner practiced in the labs.

The protein-crystallization concept used in the space industry so far predominantly operates on salting-out, though the temperature-gradient method also is applicable. The previous procedures do incur some drawbacks. The number of cells available is low. The experimenters expect having available several cells per protein, at least six cells on the average are desired. As regards ground tests, insufficient cells are available to each experimenter. In order to carry out rational serial testing under the diverse test conditions, the experimenters require many more cells which however should be identical in design with those used in space travel. Very high requirements of purity are set on the purity of the crystallization cells. In the previous designs, the cells were milled and lathed and evince joints, sealing rings and grooves which cause difficulties in cleaning and raise the problem that after use, good cleaning will be possible only at high effort.

The object of the present invention is to provide a crystallization apparatus with a substantial number of cells, where this apparatus is easily fabricated and handled.

This problem is solved by the featured design of claim 1.

The dependent claims characterized advantageous and further developments of the invention.

The design of the invention allows a large number of crystallization cells in minimal space. The manufacture of constructionally identical crystallization cells is made easier. Cleaning after use no longer is a problem. The supply of the samples needed for flight experiments or ground control tests takes place in the actual crystallization cells, whereby refilling, contamination or confusion are ruled out. The crystallization volumes are selectable across a . wide range, illustratively from 1 microliter to 500 microliters. The crystallization apparatus of the invention is equally applicable to salting-out, the drop method and the temperature-gradient method. Each sample is independent of the others. Malfunction in one of the sample-containers does not interfere with the experiments on the others. A silicone rubber tube is used as the sample-container, thereby widely excluding breakage and destruction of the sample. When the vapor-growth procedure is used, the forming crystals can be stored safely in very simple manner and be brought back to earth.

The invention is discussed below in greater detail in relation to the drawing of illustrative embodiments.

FIG. 4 is a block diagram of the crystallization apparatus of the invention,

FIGS. 5 and 6 are two embodiments of the clamp used in the apparatus of FIG. 4,

Figure 1:
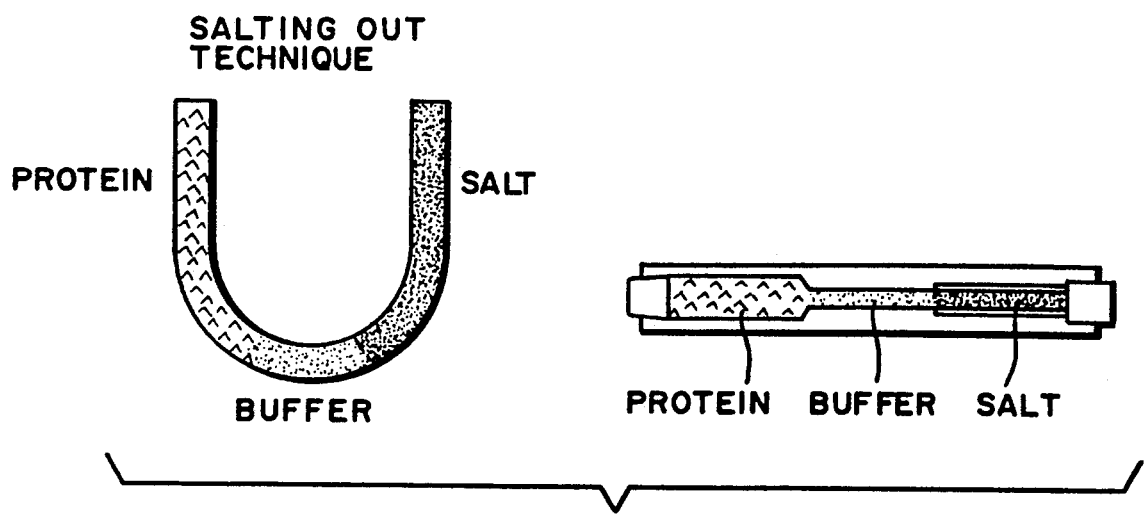
FIG. 1 is the principle of salting-out.
Figure 2:
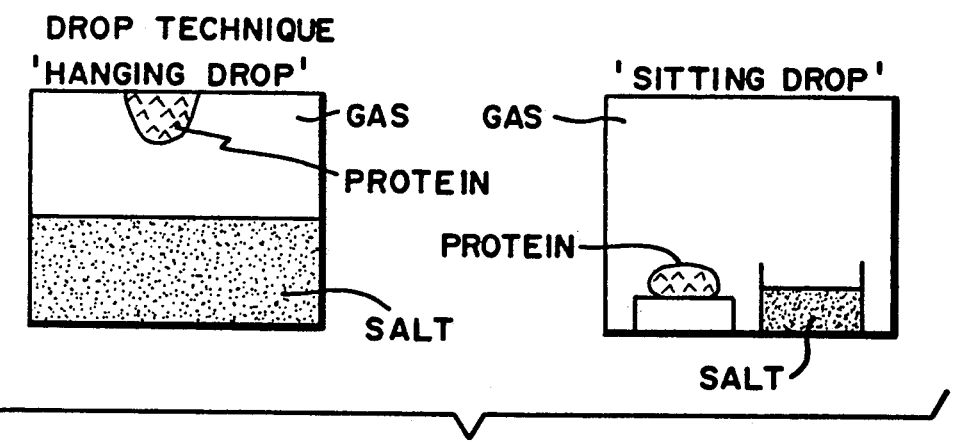
FIG. 2 is the principle of the drop method.
Figure 3:
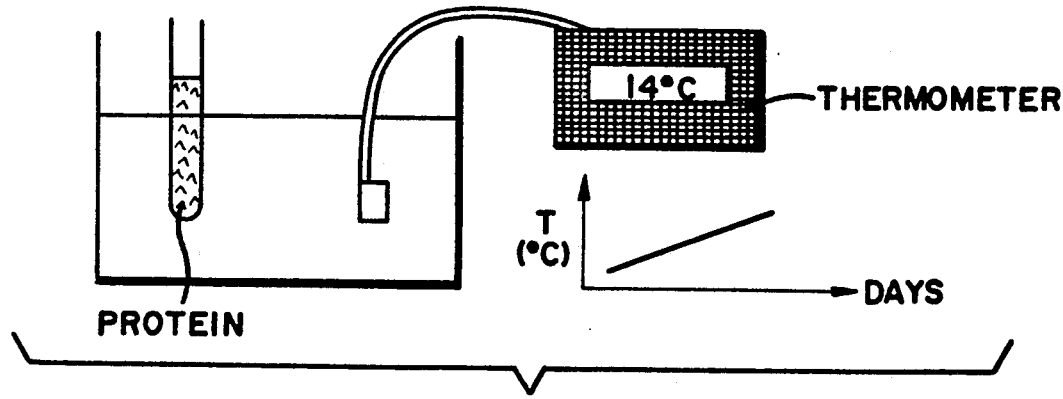
FIG. 3 is the principle of the temperature-gradient method.
Figure 8:
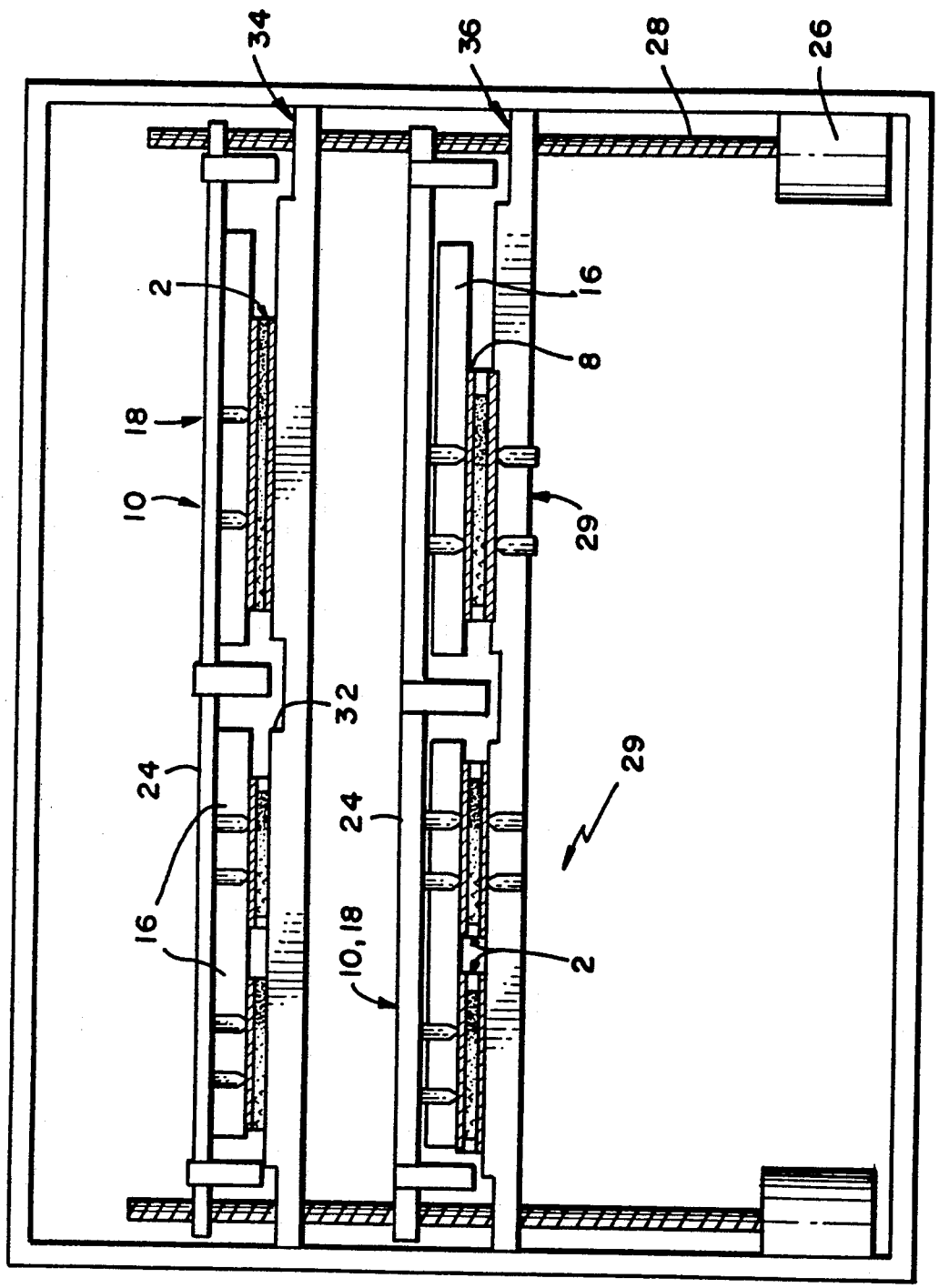
Figure 9B:
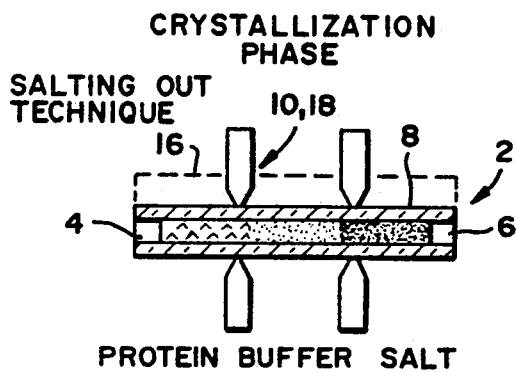
Figure 9A:
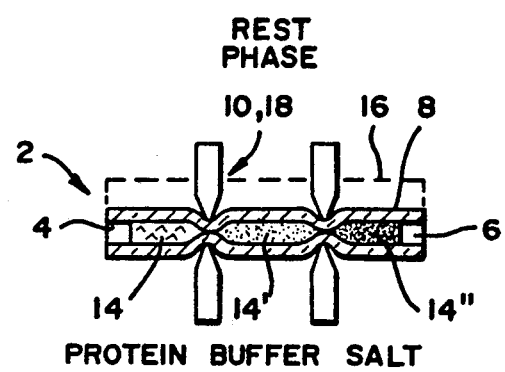
Figure 10B:
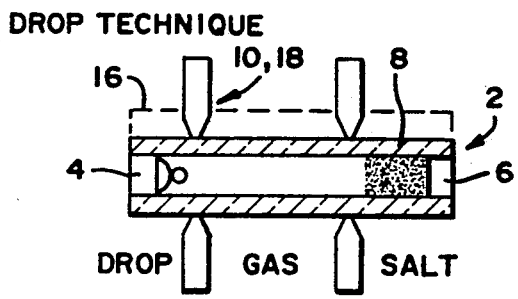
Figure 10A:
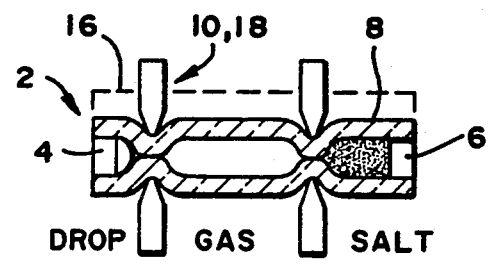
Figure 11B:
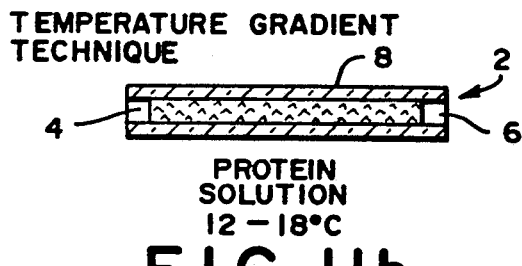
Figure 11A:
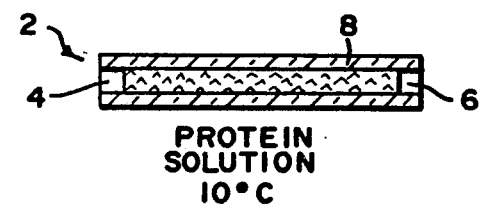
Figure 12B:
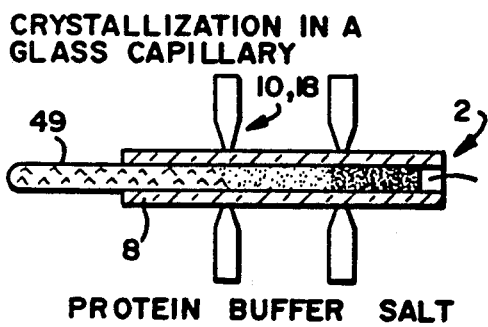
Figure 12A:
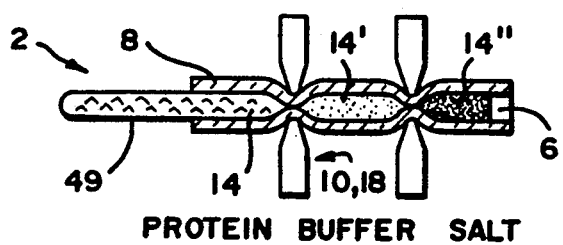
Figure 13:
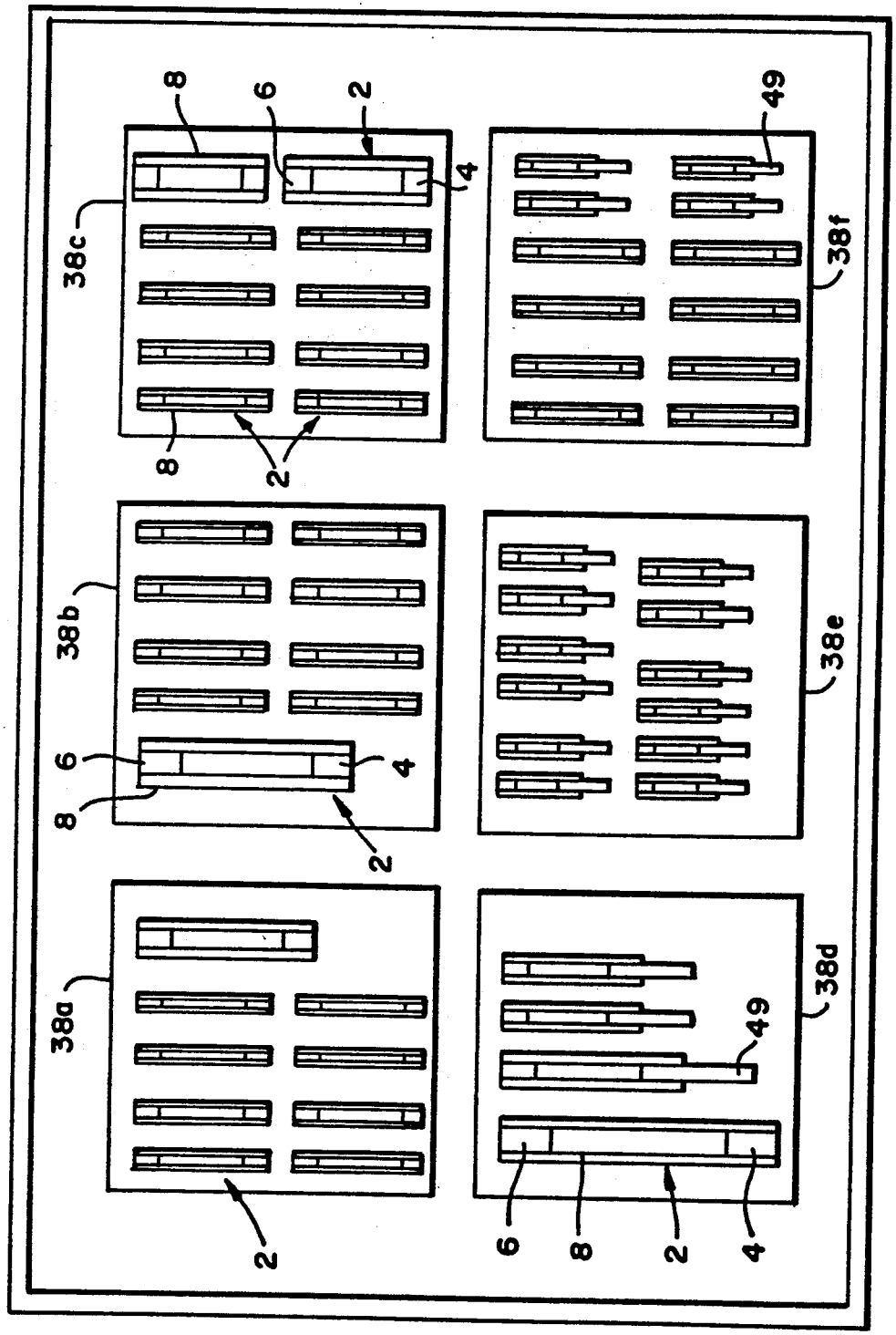
Figure 15:
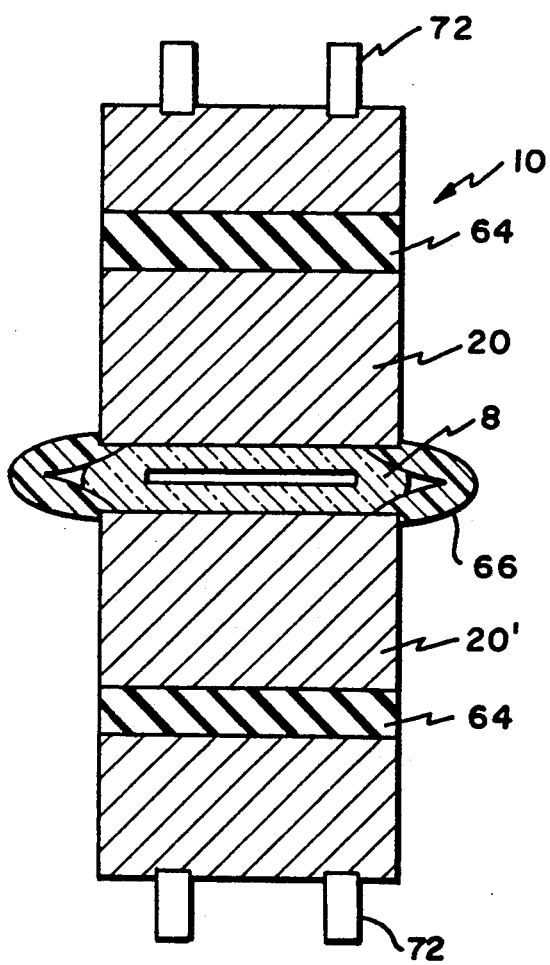
Figure 14:
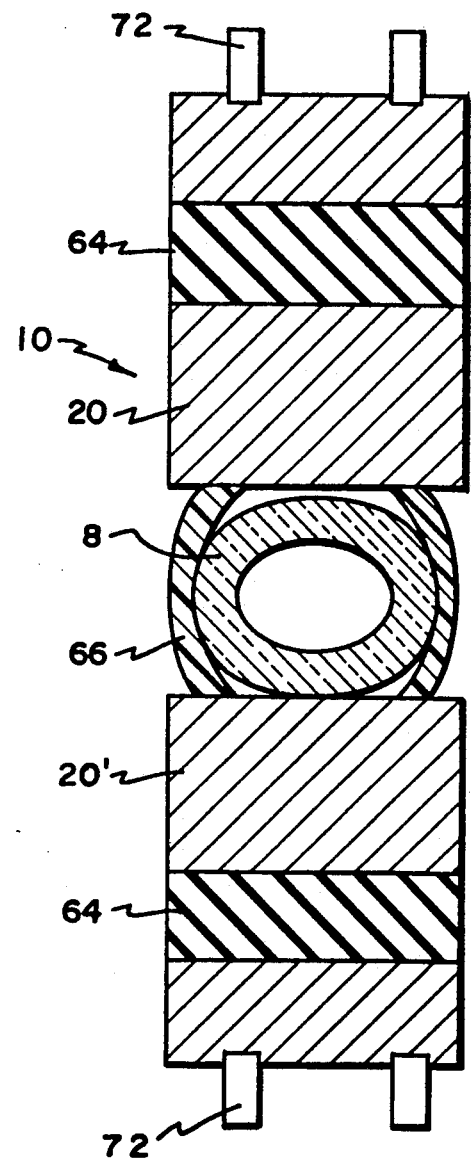
Figure 16:
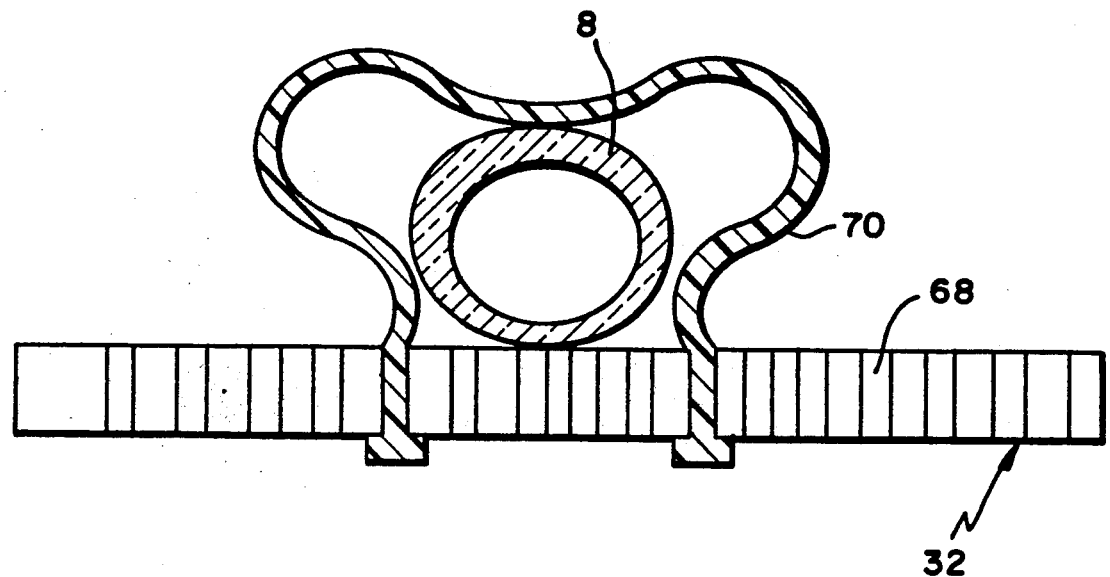
Figure 17:
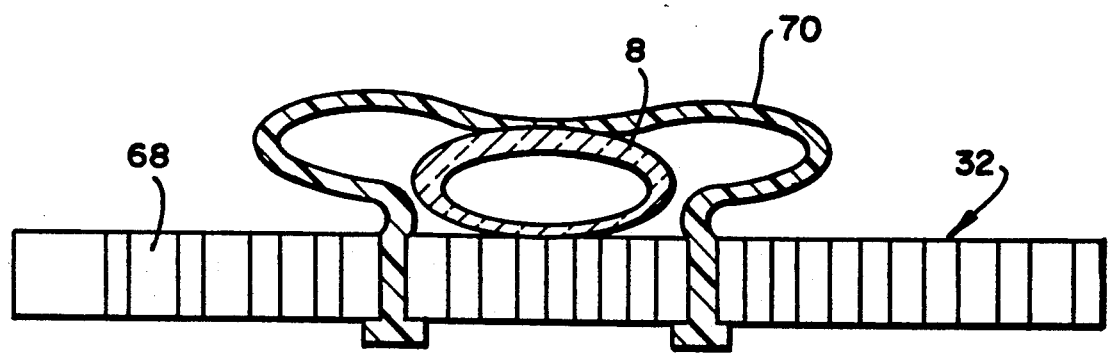
Figure 18:
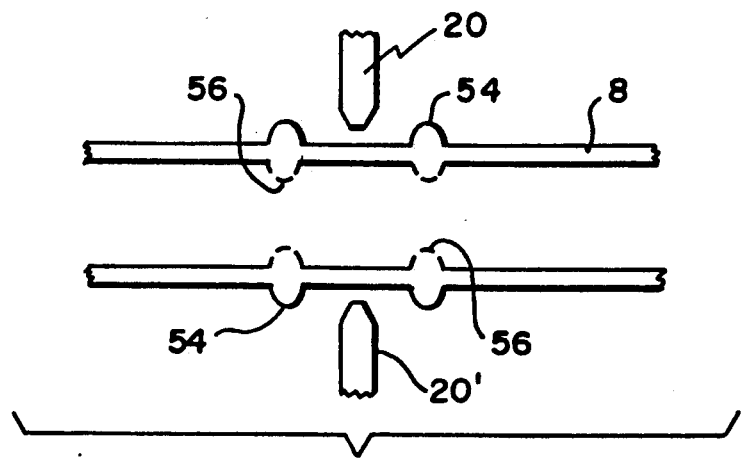
Figure 19:
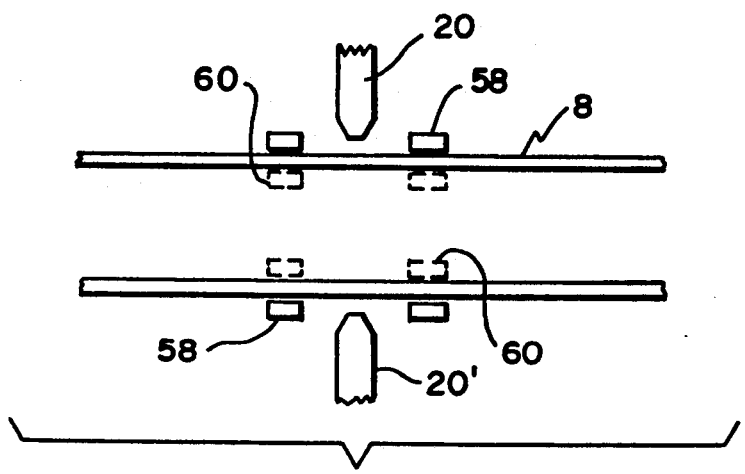
Figure 20:
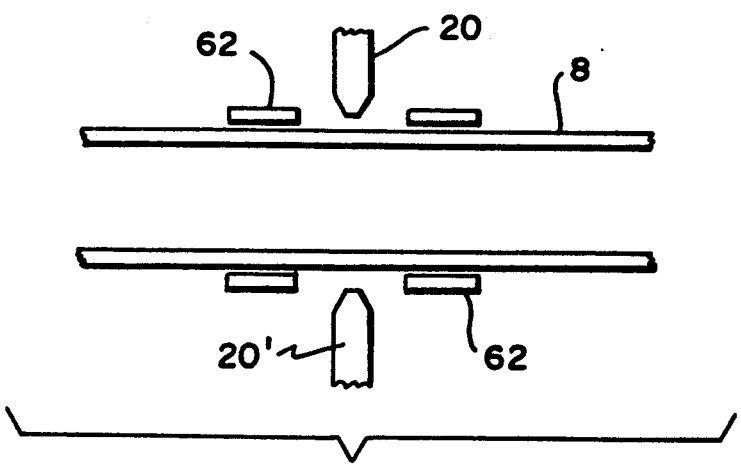

FIG. 7 is the apparatus of the invention divided into several cells using the clamp of FIG. 5, FIG. 8 is a schematic arrangement of several crystallization apparatus of the invention in several planes, FIGS. 9a and 9b schematically show the crystallization apparatus of the invention used for salting-out, FIGS. 10a, 10b schematically show the crystallization apparatus of the invention used in the drop method, FIGS. 11a, 11b schematically show the crystallization apparatus of the invention used in the temperature-gradient method, FIGS. 12a, 12b schematically show the crystallization apparatus of the invention used in a glass capillary, FIG. 13 is a topview of a sample plane, for instance for the arrangement of FIG. 8, FIG. 14 is a schematic section of a further embodiment of a clamp in the open position, FIG. 15 is the clamp of FIG. 14 in the clamping position, FIG. 16 is a schematic device to keep the crystallization apparatus in the open position, FIG. 17 schematically shows the device of FIGS. 16 in the operating position, and FIGS. 18, 19 and 20 each are a longitudinal section of an elastic hose acting as the crystallization apparatus, with reinforcements.

To the extent practical, all the Figures are referred to simultaneously below; the same reference numerals will denote the same components in these Figures.

The crystallization apparatus 2 of the invention consists of an elastic tube 8 which can be sealed laterally for instance using glass stoppers 4, 6. The tube 8 must be chemically inert and also transparent. Silicon rubber is especially suitable for such tubing.

The tube 8 is divided by a clamp 10 with several clamping sites 12, 12' into several cells 14, 14' 14" containing depending on the method being used, a salt solution, a protein solution, a buffer solution or a gas. The clamping sites or clamping elements are adjustable so that each cell size can be arbitrarily selected.

The crystallization apparatus 2 further may include a compression device 16 exerting a continuous pressure on the tube 8. This compression device 16 may consist of an elastic material. Its purpose is to prevent any partial vacuum from being set up in the cells at the various crystallization methods when passing from the rest phase shown in FIGS. 7, 9a, 10a, 11a and 12a into the crystallization phase shown in FIGS. 4, 9b, 10b, 11b, 12b and also in FIGS. 8 and 13, and thus to prevent any gas losses in the crystallization cells. When the clamps are loosened, the cell volume does increase because of the disappearance of the clamping sites.

The clamp 10 may be in the form of a compression clamp 18 with conical clamping elements 20, 20' shown in FIG. 5 or it may be a loop-clamp 22 as shown in FIG. 6. The compression clamp furthermore is shown in all the other Figures except FIG. 6.

Illustratively the compression clamp may include a clamping plate 24 to which are mounted the clamping elements 20, 20; these elements may be adjusted by a spindle 28, driving by a motor 26 or the like; see FIG. 8. A base plate 32 mounted on a stationary bearing 30 may be used as the matching bearing. Such bearings also may be in the form of individual clamping elements opposite the clamping elements 20, 20' as schematically shown in FIGS. 4, 5, 7 and 9 through 12.

The compression device 16 is located between the clamping plate 24 and the tube 8.

FIG. 8 shows two planes of samples, 34, 36, each with several zones of samples. The clamp 10, 10' associated with the sample planes are adjusted jointly by the spindle 28. More than the two zones of samples shown may be present. Each zone of samples may be equipped with its own temperature control 29 whereby both the temperature gradients and constant temperatures can be controlled for the crystallization tubes 8.

FIG. 13 is a topview of a sample plane with six sample zones 38a, 38b, 38c, 38d, 38e, 38f. FIG. 13 shows that tubes of different sizes and operating on different crystallization methods are provided in each zone if called for. Using a array of bores to fix the samples in place, the tubes can be mounted substantially as desired. The purpose is to allow each experimenter to work on his ground experiments with optimal lengths and thicknesses of his crystallization cells without thereby incurring a change in hardware for the flight experiments. The clamp planes with the clamping elements—either for compression or loop clamping—evince the same pattern.

The loop clamping device 22 of FIG. 6 consists of a sleeve 40 mounted in a hole of the bore array and on the base plate 32 of the sample; see FIG. 8. A loop 42 illustratively made of a nylon yarn or wire 43 passes through the sleeve and surrounds the tube 8. Using a threaded rod 44, the loop can be pulled tight, and again this is shown in FIG. 6. By actuating a knurled nut 46, the loop can be changed in size to match various diameters of the tubes 8. The threaded rods 44 of the individual clamping sites may be actuated simultaneously (omitted form drawing).

The described crystallization apparatus can be used for diverse procedures, as schematically shown in FIGS. 9a, 9b, 10a, 10b, 11a, 11b and 12a 12b.

FIGS. 9a and 9b show the application to salting-out. The tube 8 is sealed at each end with a planar glass stopper 4 and 6. In the rest phase (FIG. 9a) the tube 8 is divided into three cells 14, 14', 14" for a protein solution, a buffer solution and a salt solution, using the clamp 10. FIG. 9b shows the crystallization phase in which the different solutions inside the tube 8 can diffuse into each other.

FIGS. 10a and 10b show the application to the drop method, a microscopic salt solution being separated in the rest phase (FIG. 10a) from the a gas section and the gas section in turn being separated from a very small liquid volume of the protein solution. The glass stopper is conical on the side of the protein solution. The surfaces around the drop 47 by design or treatment evince strong hydrophobia. The glass stopper surface should be somewhat more wetting.

FIGS. 11a and 11b show the use of the crystallization apparatus in crystallizing proteins by the temperature-gradient method. As a rule this method requires no division into cells. The silicon tubes B are only sealed by planar stoppers.

FIGS. 12 and 12b show the use of the crystallization apparatus to crystallize inside a glass capillary. The space of crystallization in this case is inserted in the form of a glass capillary 49 fused shut at one side into the silicone tube. As a result, on one hand unhampered observation of the crystallization progress is made possible, and on the other hand, any drawbacks of the silicone surface that might be incurred in many membrane proteins will be avoided. Inserting the glass capillary fused shut at one end into a silicon tube also is especially suitable for crystallization procedures where liquid is evaporated out of the capillary tubes, or where for instance alcohol is evaporated into the capillary tubes. Contrary to the case of FIGS. 12a and 12b, no buffer solution would be present in such a technique between the salt cell and the protein cell, instead there would be a gas cell. If alcohol were used, an alcohol solution would replace the salt solution.

Various cell volumes can be subtended by using different tube sizes. Preferred tube dimensions are lengths of 20 to 80 mm, 1.5 to 5 mm outside diameters, and 1 to 4 mm inside diameters. The sizes of the cells themselves can be controlled relative to each other by shifting the clamping elements relative to each other and to the ends of the tubes.

The clamp 10 is most significant of all when using the tubes 8 to crystallize at zero gravity, in order to prevent equilibrium between the liquids separated from each other in the tubes. The clamp meets the following requirements:

It assures narrow clamping and reliably provides tube opening after clamping has been eliminated.

Narrow clamping offers the advantage that upon termination of crystallization, and upon again closing the clamping elements, the produced crystals are obtained extensively without interference. Ordinarily this might not be the case because the crystals may grow at the boundary surface between liquid and gas or liquid and liquid, where the clamping too sets in. Now FIGS. 18, 19 and 20 show special designs for the tubes 8, whereby the narrowness of the clamping is enhanced or even made possible in the first place. For that purpose the tubes 8 comprise, next to the clamping location proper, an outer and/or an inner bead 54, 56 as shown in FIG. 18. FIG. 19 shows another reinforcing means in the form of a reinforcing ring 58, 60 bonded on the inside or outside. FIG. 20 shows a reinforcing means in the form of a sleeve 62 next to the clamping location to keep the tubes 8 round.

To reliably open the clamp after it was closed, designs are provided as shown in FIGS. 14 and 15. Elastic elements 64 are integrated into the clamping elements preferably in the form of clamping wedges 20, 20', in order to achieve limitation of the compression by the clamping elements. This limitation of compression may be such that there will be no need to geometrically match every clamp to the various tube diameters. This can be done provided that the elastic element permits enough compression play.

Moreover the clamping wedges 20, 20' are mutually connected on the side by an elastic means 66 such as a nylon cord, a textile tape or the like. When the clamp is closed, this means is loosely mounted around the clamped tube 8, as shown in FIG. 15. When the clamp is open, the tape is taut and exerts a lateral pressure on the tube 8 which is still bulging, so as to constrain the opening of the tubes 8, but at the very least supporting it.

The base plate 32 on which the tubes 8 are mounted comprises a narrow arraY of boreholes 68. The boreholes 68 of this array receive elastic clamps 70 holding the tubes. FIGS. 16 and 17 show such a clamp 70 which in this instance assumes the shape of a buckle. These elastic clamps 70 are mounted on the ends of the tubes and hooked into the array of boreholes 68. The tube ends are elastically clamped in this manner so that upon release of clamping, these elastic clamps shall still positively compress the tube 8, thereby ensuring on one hand that the tube can be opened more easily and on the other hand that no partial vacuum shall arise in the tube whereby degassing of the liquids in the tube might ensue.

The mutually opposite clamping wedges 20, 20' comprise pins 72 insertable both into an array of boreholes in the base plate 32 and in an array of boreholes of the diplaceable clamping plate 24. Due to this design, a simple means is provided to block the clamping means which, following insertion of the clamped tubes between the base plate and the displaceable clamping plate, can be detached. After the clamped tubes have been inserted between the base plate and the displaceable clamping plate, this clamping plate is lowered until the clamping elements or wedges are somewhat compressed by their elastic elements 64, whereby the stop of the individual clampings can be removed. Following insertion, the clamping of the individual tubes will be determined by the position of the displaceable clamping plate relative to the base plate.

The elastic clamps 70 holding the tubes and also the clamp elements 20, 20' dividing the tubes 8 into the different crystallization cells fit into the array of boreholes 68 both of the base plate 32 and of the displaceable clamping plate 24. The fastening of the clamping elements and of the clamps can be implemented in different manner. Clamps 70 serving to fix the tubes and predominantly in the shape of buckles herein, can be fastened once suitably deformed into the arrays of boreholes. It is possible furthermore to mount these tube-fastening clamps and the clamping elements dividing the tubes into several crystallization cells on both plates 32 and 24 by means of small screws.

Another way would be to fasten the clamps and clamping elements after they have been set in place by means of pins into the arrays of boreholes using adhesives bonding them to both plates.

To avoid convection, the clamps should be loosened about two hours after rocket actuation, and this loosening should be carried out over four hours. The liquid displacements taken place then are less than the rate of diffusion of the substances.

On account of the above described design, crystals can be preserved at the liquid-liquid or liquid-gas boundary surfaces during reentry (crystals also are generated also within the individual liquid spaces). By opening the clamping elements 20, 20' at zero-gravity, volume reduction takes place in the tube. This reduction is compensated by the compression of the elastic clamps 70 used to fasten the tubes at their ends. Within the time interval of the opening of the clamping elements, this results in a volume shift of the liquids toward the clamping elements. When the clamping elements are closed again, this process takes place in the reverse order and a volume shift from the clamps toward the elastic tube fastening clamps takes place. It must be assumed that the crystals that did form underneath the clamping elements and which are much jeopardized by the clamping being applied will move toward the tube ends on account of the volume shift. Crystals that formed farther from the clamping elements are not in jeopardy.

The described crystallization apparatus is extradordinarily well suited to research protein-crystallization at zero-gravity at zero-gravity because following successful ground tests, the experimenters can thereafter supress the crystallization of filled tubes using the described apparatus in very simple and highly effective manner by the described clamp means.

I claim:

1. An apparatus for crystallizing proteins at zero gravity, comprising:
    (a) a crystallization cell formed on an elastic tube having ends adapted to be sealed;
    (b) said tube defining a cavity therein;
    (c) clamp means having open and closed positions for reversibly dividing said cavity into a plurality of cells for receiving various solutions;
    (d) said clamp means comprising a compression clamp;
    (e) means for opening and closing said clamp means;
    (f) first mechanical means for applying a first external pressure only to a peripheral portion of said tube;
    (g) said first mechanical pressure applying means being positioned in tight engagement on a first external side portion thereof;
    (h) second mechanical means for applying a second external pressure to another peripheral portion of said tube; and
    (i) said second mechanical pressure applying means being positioned in tight engagement on a second external side portion of said tube lying generally opposite to said first external side portion thereof;
    (j) wherein when said clamp means is switched from a closed to an open position for allowing intermixing of any solutions contained in said cells, said first external pressure applying means prevents formation of any partial vacuum in said tube to thereby prevent any gas losses.

2. Apparatus defined in claim 1, wherein:
    (a) said first mechanical means includes means for exerting a continuous pressure on the tube.

3. Apparatus as defined in claim 2, wherein:
    (a) said first mechanical means is made of an elastic material.

4. Apparatus defined in claim 1, wherein:
    (a) the compression clamp comprises mutually opposite clamping elements mounted externally thereto.

5. Apparatus defined by claim 4, wherein:
    (a) each of the clamping elements is generally wedge shaped.

6. Apparatus defined by claim 4, wherein:
    (a) the clamping elements comprise an elastic component to limit the compression.

7. Apparatus defined by claim 4, wherein:
    (a) the mutually opposite clamping elements are laterally connected together by an elastic tensioning means for facilitating opening of said cavity when said clamp means is opened.

8. Apparatus as defined in claim 7, wherein:
(a) the elastic tensioning means is one of a cord, a tape, and a strip made of an elastic material.

9. Apparatus defined by claim 7, wherein:
(a) the elastic tensioning means is of such a design that it will be taut and will exert a lateral pressure on the tube when the clamping means is open.

10. Apparatus defined in claim 1, wherein:
(a) the compression clamp comprises conical clamping elements and a supporting clamping plate.

11. Apparatus defined in claim 1, wherein:
(a) the compression clamp includes displaceable clamping elements.

12. Apparatus defined by claim 1, wherein:
(a) several planes of samples with several zones of tubes are provided and the clamping means for all the zones and all the planes of samples can be actuated jointly.

13. Apparatus defined in claim 12, wherein:
(a) each zone of sample tubes is provided with an individual temperature control device.

14. Apparatus defined by claim 1, wherein:
(a) the tube is made of silicone rubber.

15. Apparatus defined by claim 1, wherein:
(a) the elastic tube includes an integrally formed outer reinforcing bead disposed directly next to an anticipated clamping site.

16. Apparatus defined by claim 1, wherein:
(a) the elastic tube is provided with a sleeve to be disposed directly next to an anticipated clamping site to maintain the elastic tube substantially round when said clamp means is switched from a closed to an open position.

17. Apparatus defined by claim 1, wherein:
(a) said second mechanical means comprises a base plate comprising an array of boreholes, where elastic fastening means passing through said boreholes hold the tube securely onto the base plate.

18. Apparatus defined by claim 17, wherein:
(a) the elastic fastening means are mounted on the tube ends and are adapted to be selectively locked into the array of boreholes of the base plate.

19. Apparatus defined in claim 17, and including:
(a) a displaceable clamping plate having an array of boreholes disposed generally opposite to the base plate for holding the compression clamp relative to the tube; and
(b) the compression clamp includes generally pin-shaped elements for entering the array of boreholes of the base plate and the array of boreholes of the displaceable clamping plate.

20. Apparatus defined in claim 1, wherein:
(a) the tube ends are sealed by inserting glass stoppers therein.

21. Apparatus defined in claim 20, wherein
(a) the tubes are filled with an inert protective gas before being sealed at their ends.

22. Apparatus defined by claim 20, wherein:
(a) one of said stoppers is generally conical in shape.

23. Apparatus defined by claim 1, wherein:
(a) the elastic tube includes an integrally formed inner reinforcing bead disposed directly next to an anticipated clamping site.

24. Apparatus defined by claim 1, wherein:
(a) the elastic tube includes integrally formed inner and outer reinforcing beads disposed directly next to an anticipated clamping site.

25. Apparatus defined by claim 1, wherein:
(a) the elastic tube comprises an outer reinforcing ring disposed directly next to an anticipated clamping site.

26. Apparatus defined in claim 25, wherein:
(a) the reinforcing ring is bonded to the tube.

27. Apparatus defined by claim 1, wherein:
(a) the elastic tube comprises an inner reinforcing ring disposed directly next to an anticipated clamping site.

28. Apparatus defined by claim 1, wherein:
(a) the elastic tube comprises inner and outer reinforcing rings disposed directly next to an anticipated clamping site.

29. Apparatus defined by claim 1, wherein:
(a) the tube ends are fused shut.

30. An apparatus for crystallizing proteins at zero gravity, comprising:
(a) a crystallization cell formed of an elastic tube having ends adapted to be sealed;
(b) said tube defining a cavity therein;
(c) clamp means having open and closed positions for reversibly dividing said cavity into a plurality of cells for receiving various solutions;
(d) said clamp means comprising a loop clamp;
(e) means for opening and closing said clamp means;
(f) first mechanical means for applying a first external pressure only to a peripheral portion of said tube;
(g) said first mechanical pressure applying means being positioned in tight engagement on a first external side portion thereof;
(h) second mechanical means for applying a second external pressure to another peripheral portion of said tube; and
(i) said second mechanical pressure applying means being positioned in tight engagement on a second external side portion of said tube lying generally opposite to said first external side portion thereof;
(j) wherein when said clamp means is switched from a closed to an open position for allowing intermixing of any solutions contained in said cells, said first external pressure applying means prevents formation of any partial vacuum in said tube to thereby prevent any gas losses.

31. Apparatus defined in claim 30, wherein:
(a) the loop clamp comprises a sleeve inserted into a bore in a base plate for the tube through which is pulled a loop made of a yarn or wire surrounding the tube, and further comprises means for pulling tight or to loosen the loop.

* * * * *